United States Patent [19]

Iwaki et al.

[11] Patent Number: 4,543,504

[45] Date of Patent: Sep. 24, 1985

[54] ELECTRIC CURRENT RECTIFIER

[75] Inventors: Yoshiyuki Iwaki, Himeji; Hideo Imori, Hyogo; Hitoshi Gotou, Himeji, all of Japan

[73] Assignee: Mitsubishi Denki Kabushiki Kaisha, Tokyo, Japan

[21] Appl. No.: 551,032

[22] Filed: Nov. 14, 1983

[30] Foreign Application Priority Data

Nov. 26, 1982 [JP] Japan .......................... 57-179680[U]

[51] Int. Cl.[4] ........................................... H02K 11/00
[52] U.S. Cl. .................... 310/68 D; 310/72; 363/145
[58] Field of Search ............... 310/68 R, 68 D, 72; 320/1; 322/28, 100; 363/145

[56] References Cited

U.S. PATENT DOCUMENTS 3,538,362 11/1970 Cheetham et al. .............. 310/68 D
4,065,686 12/1977 Moore .............................. 310/68 D
4,189,653 2/1980 Hiratuka et al. ................. 310/68 D
4,268,770 5/1981 Iwaki et al. .................. 310/68 D X
4,419,597 12/1983 Shiga et al. ....................... 310/68 D
4,459,499 7/1984 Bonecker et al. ............... 310/68 R
4,489,374 12/1984 Yoshida ............................. 363/145

*Primary Examiner*—R. J. Hickey
*Attorney, Agent, or Firm*—Oblon, Fisher, Spivak, McClelland & Maier

[57] ABSTRACT

A rectifier has a pair of heat dissipating plates at the positive (+) side and the negative (−) side which constitute a full-wave rectification circuit and are positioned in mutual confrontation with a small gap between them, and an insulating material to electrically insulate the both heat dissipating plates. A recessed portion is formed in each of the mutually opposed parts of the both heat dissipating plates; a noise-preventing capacitor element is housed in a closed space defined by the recessed portions to make an outer covering for the capacitor, and the capacitor element and each of the heat dissipating plates are electrically connected.

8 Claims, 4 Drawing Figures

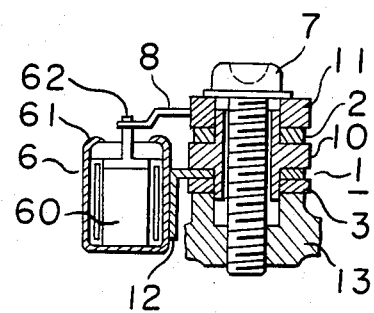

ELECTRIC CURRENT RECTIFIER

BACKGROUND OF THE INVENTION

1. Field of the Invention

This invention relates to an improvement in a construction of an electric current rectifier, and, more particularly, it is concerned with improvement in attachment of a noise-preventing capacitor to be used mainly for an a.c. generator of an automotive vehicle.

2. Description of the Prior Art

FIGS. 1 and 2 of the accompanying drawing illustrates embodiments of conventional electric generator of this kind. In these figures of drawing, a rectifier 1 comprises heat dissipating plates 2 and 3 (or heatsink) at the positive (+) side and the negative (−) side, respectively, both being disposed in mutual confrontation; diodes 4 and 5 are respectively provided at the positive (+) side and the negative (−) side of the rectifier. An insulative member 10 is interposed between the heat dissipating plates 2,3. A fitting screw 7 passes through the inner peripheral part of the insulative member 10 and the end of the screw is engaged with the female screw formed in the bracket of an a.c. generator for automotive vehicles to fasten the heat dissipating plates 2,3 and the insulative member 10 together with an output terminal 8 at the positive side, a spacer 11 and a holding plate 12 for holding a noise-preventing capacitor 6.

The noise-preventing capacitor 6 in the conventional electric current rectifying device was in a general construction such that its casing 61 is fixed by the fitting screw 7 and grounded, and a terminal 62 having a lead wire is connected with the output terminal 8 which has been electrically connected with the heat dissipating plate 2 at the positive (+) side of the rectifier 1.

This conventional device, however, uses various sorts of parts such as the casing 61 to be an outer cover for receiving therein a capacitor element 60, the terminal 61, and so on, which have no direct bearing on the operational function of the device, on account of which the device inevitably has a complicated structure, hence a high manufacturing cost.

SUMMARY OF THE INVENTION

It is therefore the primary object of the present invention to provide a rectifier of an improved construction and excellent function to be described hereinbelow and to be free from the above-mentioned various disadvantages inherent in the conventional rectifying device.

According to the present invention in general aspect of it, there is provided a rectifier having a pair of heat dissipating plates (or heatsink plates) at the positive (+) side and the negative (−) side which constitute a full-wave rectification circuit and are positioned in mutual confrontation with a small gap between them, and an insulating plate to electrically insulate the both heat dissipating plates, characterized in that a recessed portion is formed in each of the mutually opposed parts of said both heat dissipating plates, then a noise-preventing capacitor element is housed in a closed space defined by said recessed portions to make an outer covering for said capacitor, and said capacitor element and each of said heat dissipating plates are electrically connected.

BRIEF DESCRIPTION OF THE DRAWINGS

The foregoing object, other objects as well as specific construction and function of the rectifier according to the present invention will become more apparent and understandable from the following detailed description thereof, when read in conjunction with the accompanying drawing illustrating a couple of preferred embodiments thereof.

In the drawing:

FIG. 1 is a cross-sectional view showing a conventional rectifier;

FIG. 2 is a general electrical circuit diagram of the rectifier;

FIG. 3 is a cross-sectional view showing one embodiment of the rectifier according to the present invention; and FIG. 4 is a cross-sectional view showing another embodiment of the rectifier according to the present invention.

DETAILED DESCRIPTION OF THE PREFERRED EMBODIMENT

In the following, the present invention will be explained in detail with reference to the preferred embodiments thereof as shown in FIGS. 3 and 4.

First of all, FIG. 3 illustrates one embodiment of the present invention. Recessed portions 21 and 31 are formed at mutually opposite end parts projecting from the body parts of the heat dissipating plates or heatsink plates 2 and 3 which are respectively made of die-cast aluminum. An insulating plate 9 which is provided separate from the insulative member 10 interposed between the heat dissipating plates 2, 3, is held between the outer edges of the recessed portions 21, 31. A capacitor element 60 is received and housed in a closed space formed by the above-mentioned recessed portions 21 and 31.

In more detail, in this embodiment of the invention, the capacitor element 60 is received in a closed space defined by the two recessed portions 21 and 31, the positive (+) side and the negative (−) side at both ends of the capacitor element 60 are electrically connected with the heat dissipating plates 2 and 3, respectively so that electrical power is obtainable from the positive (+) side of the heat dissipating plate. The closed space is maintained in a hermetially sealed condition with the insulating plate 9 interposed between the end parts of the heat dissipating plates 2, 3 for required insulation. Thus, the rectifier 1 having the heat dissipating plates 2, 3 between which the insulating plate 9 and the insulative member 10 and respectively interposed is fixed to the braket 13.

When so constructed, the device no longer requires the holding plate 12 to mount the capacitor therein, the casing 61 exclusively for the capacitor, the terminal 62, and the output terminal 8 as used in the conventional device shown in FIG. 1, whereby the rectifier device with its capacitor element 60 being perfectly sealed in a reasonable way can be provided.

FIG. 4 illustrates another embodiment of the device according to the present invention, wherein reference numerals 22 and 32 designate grooves, each being formed in and at the projected distal end of the recessed portion 21 and 31 of the heat dissipating plates 2 and 3 respectively; a gasket 91 having an "O-ring" portion 92, made of a highly elastic material such as, for example, rubber serves to augment sealing function of the housing for the capacitor element 60.

In this embodiment of the invention, the O-ring portion 92 of the gasket 91 is fitted in the grooves 22 and 32 of the respective heat dissipating plates 2 and 3, whereby the sealing of the capacitor 60 can be secured with good effect.

As stated in the foregoing, since the present invention is so constructed that the mutually opposite parts of the heat dissipating plates at both positive (+) and negative (−) sides have the recessed portions formed therein, the noise-preventing capacitor element is housed in these recessed portions which constitute, when joined together, the outer cover for the capacitor, and further the capacitor element and each of the heat dissipating plates are electrically connected, the structure for mounting the capacitor becomes extremely simple, and the device of a low price is made available.

Although, in the foregoing, the present invention has been described specifically with reference to the preferred embodiments thereof, it is to be noted that the invention is not limited to these embodiments alone, but any change and modification may be made by those persons skilled in the art within the ambit of the present invention as in the appended claims.

We claim:

1. A rectifier having a pair of heat dissipating plates at the positive (+) side and the negative (−) side which constitute a full-wave rectification circuit and are positioned in mutual confrontation with a small gap between them, and an insulating material to electrically insulate the both heat dissipating plates, characterized in that a recessed portion is formed in each of the mutually opposed parts of said both heat dissipating plates, then a noise-preventing capacitor element is housed in a closed space defined by said recessed portions to make an outer covering for said capacitor, and said capacitor element and each of said heat dissipating plates are electrically connected.

2. The rectifier as set forth in claim 1 wherein said heat dissipating plates are made of die-cast aluminum.

3. The rectifier as set forth in claim 1 wherein the recessed portions of said heat dissipating plates are respectively formed at portions projecting from the body parts of said heat dissipating plates.

4. The rectifier as set forth in claim 2, wherein said insulating material is made up by an insulative member for insulating the body parts of said heat dissipating plates from each others and a insulating plate for insulating the outer edge of the entrance of said recessed portions in mutual confrontation.

5. The rectifier as set forth in claim 3, wherein a groove is formed in the outer edge of the entrance of said recessed portion of each of said heat dissipating plates to hold said insulating plate.

6. The rectifier as set forth in claim 4, wherein said insulating plate is a gasket having an O-ring portion therein.

7. The rectifier as set forth in claim 1, wherein said heat dissipating plates between which the insulating plate and the insulative member are respectively interposed, are fixed to the bracket of an a.c. generator.

8. The rectifier as set forth in claim 6, wherein the negative (−) side of said heat dissipating plate is electrically connected to said bracket to be grounded so that electrical power is obtainable from the positive (+) side of said heat dissipating plate.

* * * * *